(12) United States Patent
Kim et al.

(10) Patent No.: US 9,886,986 B2
(45) Date of Patent: Feb. 6, 2018

(54) VOLTAGE REGULATOR, MEMORY SYSTEM HAVING THE SAME AND OPERATING METHOD THEREOF

(71) Applicant: SK hynix Inc., Icheon-si, Gyeonggi-do (KR)

(72) Inventors: Ki Soo Kim, Icheon-si (KR); Jin Seong Kang, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/473,139

(22) Filed: Mar. 29, 2017

(65) Prior Publication Data

US 2017/0200480 A1    Jul. 13, 2017

Related U.S. Application Data

(62) Division of application No. 15/049,759, filed on Feb. 22, 2016, now Pat. No. 9,647,538.

(30) Foreign Application Priority Data

Sep. 21, 2015   (KR) .................. 10-2015-0133034

(51) Int. Cl.
*G11C 5/14* (2006.01)
*H02M 3/07* (2006.01)

(52) U.S. Cl.
CPC .............. *G11C 5/147* (2013.01); *G11C 5/145* (2013.01); *H02M 3/07* (2013.01)

(58) Field of Classification Search
CPC ...... G11C 5/147; G11C 11/4074; G11C 16/30; G11C 5/145; G11C 13/0038;
(Continued)

(56) References Cited

U.S. PATENT DOCUMENTS

| | | | |
|---|---|---|---|
| 6,249,445 B1 | 6/2001 | Sugasawa | |
| 2005/0237825 A1* | 10/2005 | Kawajiri | G11C 16/12 365/189.11 |

(Continued)

FOREIGN PATENT DOCUMENTS

| | | |
|---|---|---|
| KR | 1020120119320 A | 10/2012 |
| KR | 1020130072657 A | 7/2013 |

*Primary Examiner* — Uyen B Tran
(74) *Attorney, Agent, or Firm* — William Park & Associates Ltd.

(57) ABSTRACT

Provided herein are a voltage regulator, a memory system having the same and an operation method thereof. The memory system includes a memory device configured to store data, a controller configured to control the memory device, and a voltage regulator configured to supply a pump-out voltage to the memory device or the controller so that the memory device or the controller is operated in the following manner: until a level of the pump-out voltage is increased to a second reference voltage lower than a first reference voltage, the pump-out voltage is output using a clock having a first frequency; when the pump-out voltage exceeds the second reference voltage and does not exceed the first reference voltage, the pump-out voltage is output using a clock having a second frequency lower than the first frequency; and when the pump-out voltage exceeds the first reference voltage, the pump-out voltage is output using the clock having the first frequency.

4 Claims, 7 Drawing Sheets

(58) Field of Classification Search
CPC .......... G11C 29/021; G11C 5/14; H02M 3/07; H02M 2001/0003; H02M 3/073
See application file for complete search history.

(56) References Cited

U.S. PATENT DOCUMENTS

2007/0085597 A1    4/2007   Okada et al.
2010/0054074 A1    3/2010   Ryu
2015/0180334 A1    6/2015   Jeong et al.

* cited by examiner

VOLTAGE REGULATOR, MEMORY SYSTEM HAVING THE SAME AND OPERATING METHOD THEREOF

CROSS-REFERENCE TO RELATED APPLICATION

The present application is a divisional application of U.S. application Ser. No. 15/049,759, filed on Feb. 22, 2016, and claims priority to Korean patent application number 10-2015-0133034 filed on Sep. 21, 2015, the entire disclosure of which is incorporated herein in its entirety by reference.

BACKGROUND

Field of the Invention

Various embodiments of the present disclosure relate to a regulator, a memory system having the same, and an operating method thereof.

Description of Related Art

Due to the increased use of mobile information devices using a memory system as a storage medium (i.e., smart phones, tablet PCs, etc.), there has been a growing interest and importance in the semiconductor memory device.

Due not only to parallelization with the use of a high-speed processor or multi-core processor, the development of various applications has increased the reliability and performance within the required level of the semiconductor memory systems.

Memory systems are memory devices embodied using a semiconductor comprised of, for example, silicon (Si), germanium (Ge), gallium arsenide (GaAs), indium phosphide (InP), or the like. The memory systems are classified into volatile memory devices and nonvolatile memory devices. The volatile memory device is a memory device in which data stored therein is lost when power is turned off. Representative examples of the volatile memory device include static RAM (SRAM), dynamic RAM (DRAM), synchronous DRAM (SDRAM), etc. The nonvolatile memory device is a memory device in which data stored therein is maintained even when power is turned off. Representative examples of the nonvolatile memory device include read only memory (ROM), programmable ROM (PROM), electrically programmable ROM (EPROM), electrically erasable programmable ROM (EEPROM), flash memory, phase-change random access memory (PRAM), magnetic RAM (MRAM), resistive RAM (RRAM), ferroelectric RAM (FRAM), etc. Flash memory is classified into NOR type and NAND type memory.

The memory systems may include a memory device which stores data, and a voltage regulator which is provided to stably supply a control voltage for controlling the memory device.

BRIEF DESCRIPTION OF THE DRAWINGS

In the drawing figures, dimensions may be exaggerated for clarity of illustration. It will be understood that when an element is referred to as being "between" two elements, the element may be the only element between the two elements, or one or more intervening elements may also be present. Like reference numerals refer to like elements throughout.

DETAILED DESCRIPTION

Example embodiments will now be described more fully hereinafter with reference to the accompanying drawings; however, the example embodiments may be embodied in different forms and should not be construed as limited to the embodiments set forth herein. Rather, these embodiments are provided so that this disclosure will be thorough, and will fully convey a scope of example embodiments to those skilled in the art.

A voltage regulator which can stably supply a voltage, systems of the present disclosure, and methods are described herein in various embodiments.

One embodiment of the present disclosure provides a voltage regulator which includes a pump configured to generate a pump-out voltage in response to a pump clock; and pump circuits configured such that the pump clock has a first frequency or a second frequency lower than the first frequency depending on the pump-out voltage.

Another embodiment of the present disclosure provides a memory system which includes a memory device configured to store data; a controller configured to control the memory device; and a voltage regulator configured to supply a pump-out voltage to the memory device or the controller so that the memory device or the controller is operated in the following manner: until a level of the pump-out voltage is increased to a second reference voltage lower than a first reference voltage, the pump-out voltage is output using a clock having a first frequency; when the pump-out voltage exceeds the second reference voltage without exceeding the first reference voltage, the pump-out voltage is output using a clock having a second frequency lower than the first frequency; and when the pump-out voltage exceeds the first reference voltage, the pump-out voltage is output using the clock having the first frequency.

Yet another embodiment of the present disclosure provides a method of operating a voltage regulator in the following manner: outputting a pump-out voltage using a pump clock having a first frequency; outputting the pump-out voltage using the pump clock having a second frequency lower than the first frequency when the pump-out voltage exceeds the second reference voltage lower than the first reference voltage; and outputting the pump-out voltage using the pump clock having the first frequency when the pump-out voltage exceeds the first reference voltage.

Hereinafter, a voltage regulator, systems, and methods will be described in detail with reference to the attached drawings in various embodiments. Those skilled in the art will appreciate that various modifications are possible, and the present disclosure is not limited to the following embodiments. Furthermore, the embodiments of the present disclosure aim to help those with ordinary knowledge in this art to more clearly understand the present disclosure.

Figure 1:
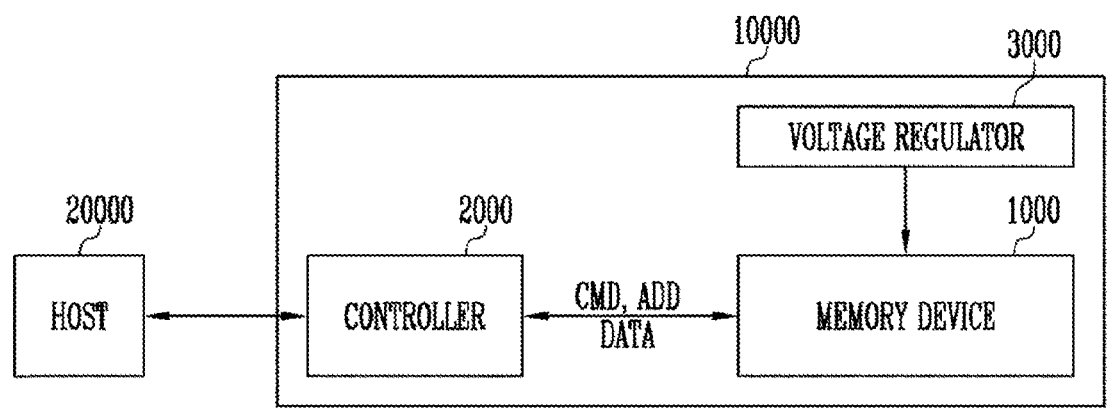
FIG. 1 is a view illustrating a memory system according to an embodiment of the present disclosure.

FIG. 1 is a view illustrating a memory system according to an embodiment of the present disclosure.

Referring to FIG. 1, the memory system 10000 includes a memory device 1000 that stores data and a controller 2000 that controls the memory device 1000. The memory system 10000 may further include a voltage regulator 3000 which supplies voltages to the memory device 1000 or the controller 2000. Although the voltage regulator 3000 is illustrated as supplying a voltage to the memory device 1000 in FIG. 1, a voltage regulator may be connected to the controller 2000 to supply a voltage thereto.

The memory device 1000 may include, inter alia, a DDR SDRAM (double data rate synchronous dynamic random access memory), an LPDDR4 (low power double data rate4) SDRAM, a GDDR (graphics double data rate) SDRAM, an LPDDR (low power DDR), a RDRAM (rambus dynamic random access memory) or a flash memory which is a nonvolatile memory device. In the following embodiment, the memory device 1000, including a NAND flash memory, will be described as a representative example.

The controller 2000 controls the overall operation of the memory device 1000. In response to a command received from the host 20000, the controller 2000 may output a command CMD and an address ADD for controlling the memory device 1000, and input/output data DATA.

The host 20000 may communicate with the memory system 10000 by using, inter alia, an interface protocol such as a PCI-E (peripheral component interconnect-express), an ATA (advanced technology attachment), an SATA (serial ATA), a PATA (parallel ATA) or an SAS (serial attached SCSI).

The voltage regulator 3000 is configured to stably supply an external voltage to the memory device 1000.

Figure 2:
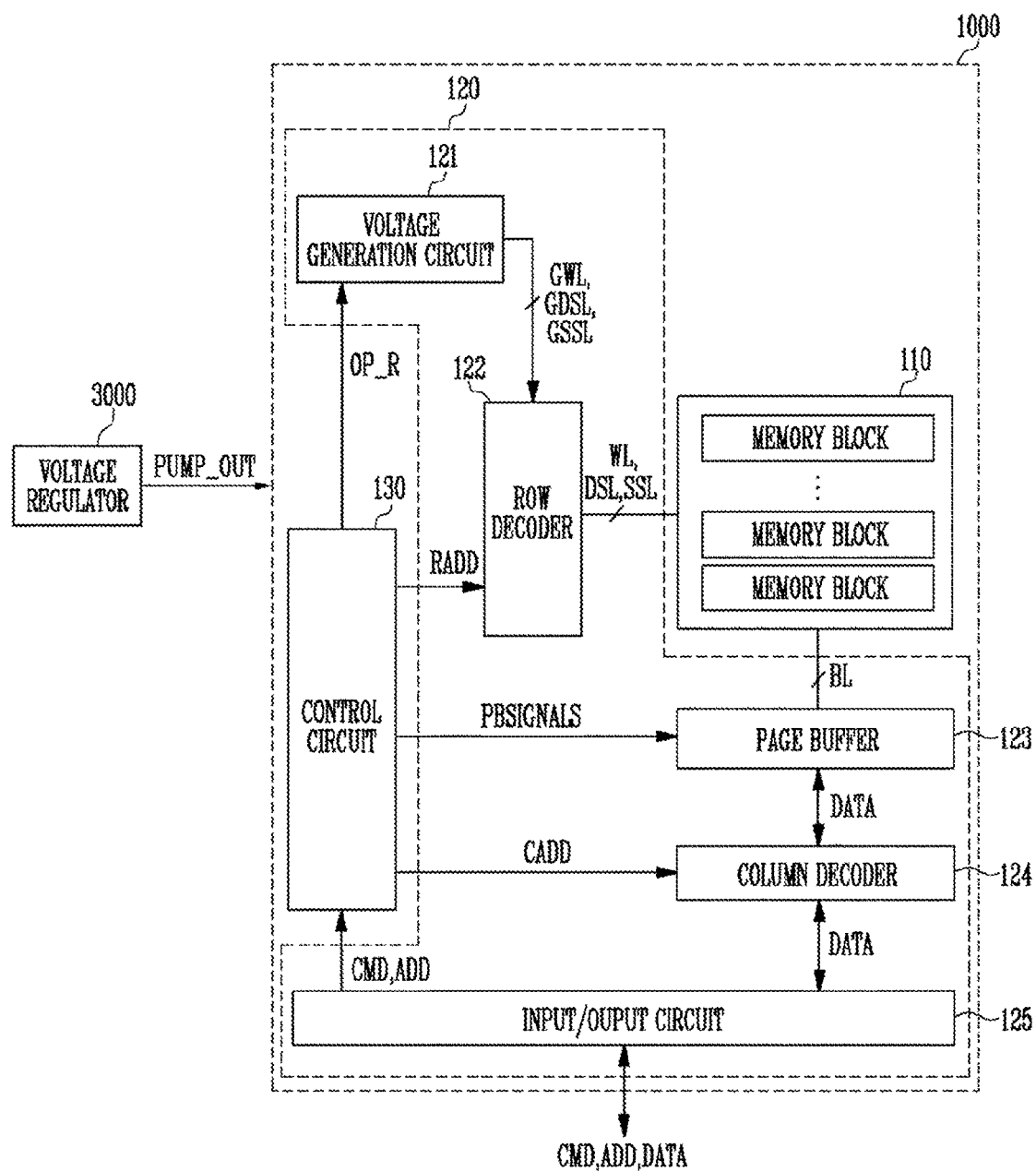
FIG. 2 is a view illustrating in detail the memory device of FIG. 1.

FIG. 2 is a view illustrating in detail the memory device of FIG. 1. The memory device 1000 including a NAND flash memory will be described as an example.

Referring to FIG. 2, the memory device 1000 includes a memory cell array 110 which stores data, a peripheral circuit 120 which is configured to perform a program operation, a read operation, or an erase operation of the memory cell array 110, and a control circuit 130 which is configured to control the peripheral circuit 120.

The memory cell array 110 includes a plurality of memory blocks having the same configuration. Each of the memory blocks includes a plurality of strings. Each of the plurality of strings includes a plurality of memory cells which store data. The strings may form a two-dimensional structure in which they are horizontally arranged on a substrate or a three-dimensional structure in which they are vertically arranged. The memory cells may be formed of cells capable of storing one bit of data per cell, such as single-level cells (SLC). The memory cells may also be formed of cells capable of storing two or more bits of data per cell, such as multi-level cells (MLC), triple-level cells (TLC), and quadruple-level cells (QLC). Specifically, the multi-level cells (MLC) are configured such that two bits of data are stored in each memory cell, the triple-level cells (TLC) are configured such that three bits of data are stored in each memory cell, and the quadruple-level cells (QLC) are configured such that four bits of data are stored in each memory cell. Among the memory cells included in different strings, a group of memory cells connected to the same word line is referred to as a page.

The peripheral circuit 120 includes a voltage generation circuit 121, a row decoder 122, a page buffer 123, a column decoder 124 and an input/output circuit 125.

The voltage generation circuit 121 generates various levels of operating voltages in response to an operating signal OP_R. For example, during a program operation, the voltage generation circuit 121 may generate a program voltage, a pass voltage, a turn-on voltage, etc. and transfer the generated voltages to global word lines, global drain select lines and global source select lines.

The row decoder 122 may be connected to the voltage generation circuit 121 through global word lines GWL, global drain select lines GDSL, and global source select lines GSSL and may be connected to the memory cell array 110 through word lines WL, drain select lines DSL, and source select lines SSL. In response to a row address RADD, the row decoder 122 transfers operating voltages generated by the voltage generation circuit 121 to selected memory blocks in the memory cell array 110. For example, the row decoder 122 transfers voltages applied to the global word lines GWL to the corresponding word lines WL, transfers voltages applied to the global drain select lines GDSL to the corresponding drain select lines DSL, and transfers voltages applied to the corresponding global source select lines GSSL to the source select lines SSL.

The page buffer 123 is connected to each of the memory blocks included in the memory cell array 110 in a similar manner, through bit lines BL. In response to page buffer control signals PBSIGNALS, the page buffer 123 may pre-charge the bit lines BL, exchange data with selected memory blocks during the program or read operation, and temporarily store received data.

The column decoder 124, in response to a column address (CADD), may exchange data DATA with the page puffer 123 or exchange data DATA with the input/output circuit 125.

The input/output circuit 125 may transfer an external command CMD and an external address ADD to the control circuit 130, transfer data DATA to the column decoder 124 or receive data DATA from the column decoder 124, and output data DATA to the controller 2000 or input data DATA from the external device.

The control circuit 130 controls the peripheral circuit 120 in response to the command CMD and the address ADD.

Voltage is required to operate the above-mentioned elements. Such voltage can be supplied by the voltage regulator 3000. For example, the voltage regulator 3000 may convert a voltage supplied from the outside into a voltage with a constant level and output the constant voltage as a pump-out voltage PUMP_OUT. The memory device 1000 may be operated with the pump-out voltage PUMP_OUT supplied thereto.

Figure 3:
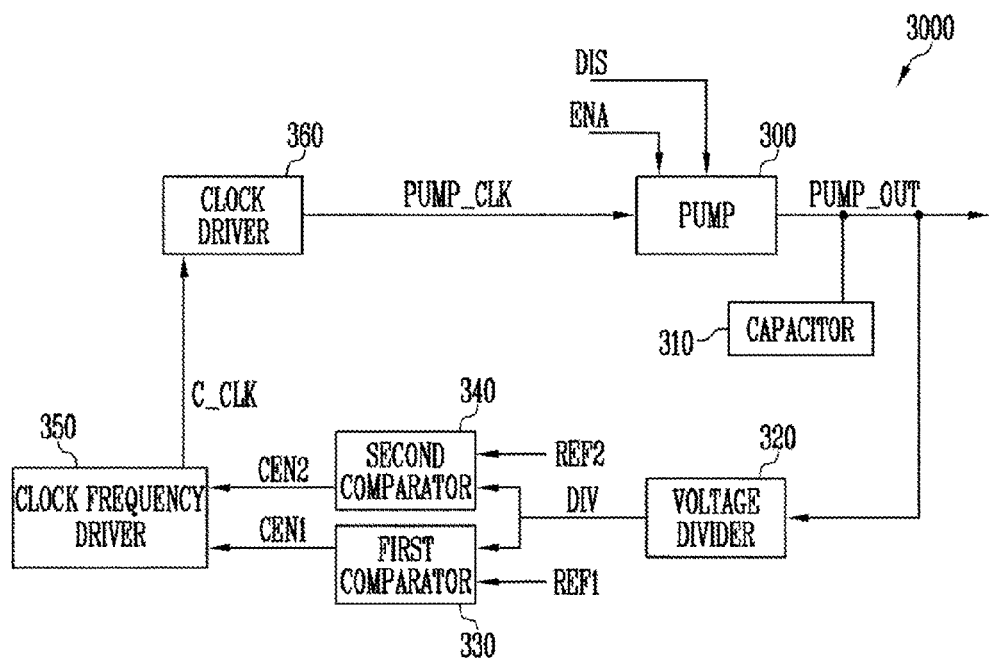
FIG. 3 is a view illustrating in detail the voltage regulator of FIG. 1.

FIG. 3 is a view illustrating in detail the voltage regulator of FIG. 1.

Referring to FIG. 3, the voltage regulator 3000 may include a pump 300, a capacitor 310, a voltage divider 320, a first comparator 330, a second comparator 340, a clock frequency driver 350 and a clock driver 360.

When receiving a pump enable signal ENA, the pump 300 may pump a voltage in response to a pump clock PUMP_CLK and may output the pumped voltage as a pump-out voltage PUMP_OUT. However, when a discharge signal DIS is transmitted to the pump 300, the pump-out voltage PUMP_OUT is not outputted regardless of the pump clock PUMP_CLK.

The capacitor 310 is connected to a node from which the pump-out voltage PUMP_OUT is outputted and is configured to prevent a sudden change in voltage level of the pump-out voltage PUMP_OUT.

The voltage divider 320 divides the pump-out voltage PUMP_OUT to a predetermined level of voltage and outputs it as a divided voltage DIV.

The first comparator 330 compares the divided voltage DIV with a first reference voltage REF1 and outputs a first clock enable signal CEN1.

The second comparator 340 compares the divided voltage DIV with a second reference voltage REF2 and outputs a second clock enable signal CEN2. The second reference voltage REF2 is set to have a voltage level less than the first reference voltage REF1.

The clock frequency driver 350 outputs a clock C_CLK in response to the first or second clock enable signal CEN1 or CEN2.

In response to the clock C_CLK, the clock driver 360 outputs a pump clock PUMP_CLK to operate the pump 300.

In theory, the capacitor 310 may include a high-voltage transistor or a low-voltage transistor to prevent a sudden change in voltage level of a pump-out voltage PUMP_OUT. A high-voltage transistor having a high breakdown voltage may be used to withstand the high pump-out voltage PUMP_OUT if the pump-out voltage PUMP_OUT is relatively high. However, if the pump-out voltage PUMP_OUT is relatively low, a low-voltage transistor may be used to embody the capacitor 310.

The low-voltage transistor is smaller in area compared to the high-voltage transistor. For instance, the low-voltage transistor may have ⅙ of the area of the high-voltage transistor. Therefore, if the low-voltage transistor, and not the high-voltage transistor, is used, the area of the voltage regulator 3000 can be reduced. However, using a low-voltage transistor has limitations. If the pump-out voltage PUMP_OUT is higher than the breakdown voltage, the low-voltage transistor may be damaged.

Given this, the present embodiment uses the low-voltage transistor to reduce the area of the voltage regulator 3000 and includes the second comparator 340 and the clock frequency driver 350 in order to reduce the peak voltage of the pump-out voltage PUMP_OUT.

Some of the above-mentioned elements will be described in more detail below.

Figure 4:
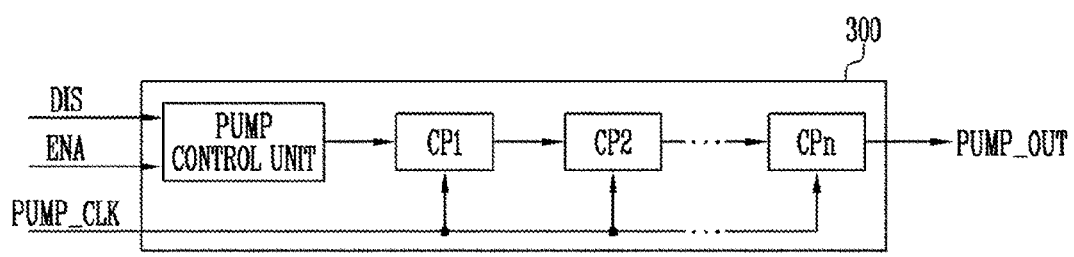
FIG. 4 is a view illustrating an embodiment of the pump of FIG. 3.

FIG. 4 is a view illustrating an embodiment of the pump of FIG. 3.

Referring to FIG. 4, the pump 300 can be configured in various forms. For instance, the pump 300 may include first to n-th charge pumps CP1 to CPn (where n is a positive integer) and a pump control unit which controls the first to n-th charge pumps CP1 to CPn. The first to n-th charge pumps CP1 to CPn may be connected in series, in parallel, or a combination of both. As an example, FIG. 4 discloses the first to n-th charge pumps CP1 to CPn being connected in series to each other. When the pump control unit receives a pump enable signal ENA, the pump control unit may output a first voltage. The first voltage is supplied to the first charge pump CP1. When a pump clock PUMP_CLK is applied to the first charge pump CP1, the first charge pump CP1 may pump the first voltage and output a second voltage with a level higher than that of the first voltage. In this way, each of the first to n-th charge pumps CP1 to CPn can output a pump-out voltage PUMP_OUT with a level higher than that of the supplied voltage in response to the pump clock PUMP_CLK.

Figure 5:
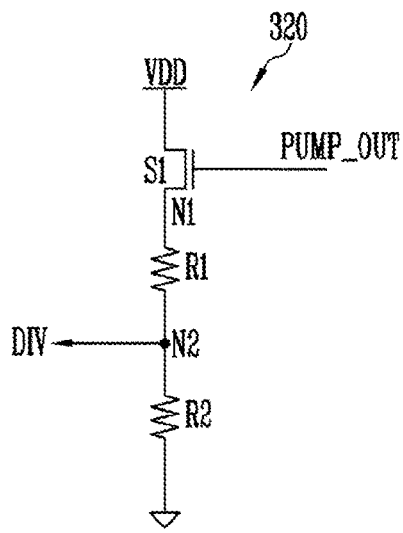
FIG. 5 is a view illustrating an embodiment of the voltage divider of FIG. 3.

FIG. 5 is a view illustrating an embodiment of the voltage divider of FIG. 3.

Referring to FIG. 5, the voltage divider 320 can be configured in various forms. For example, the voltage divider 320 may include a first switch S1 and first and second resistors R1 and R2. The first switch S1 may be connected between a terminal, to which power supply voltage VDD is applied, and a first node N1. The first switch S1 may be embodied by an NMOS transistor which is turned on or off in response to a pump-out voltage PUMP_OUT. Since the turn-on level of the first switch S1 can vary depending on the pump-out voltage PUMP_OUT, the voltage applied to the first node N1 may also vary depending on the pump-out voltage PUMP_OUT. The first resistor R1 may be connected between the first node N1 and a second node N2. The second resistor R2 may be connected between the second node N2 and a ground terminal. The divided voltage DIV that is divided by the first and second resistors R1 and R2 is output through the second node N2.

Figure 6:
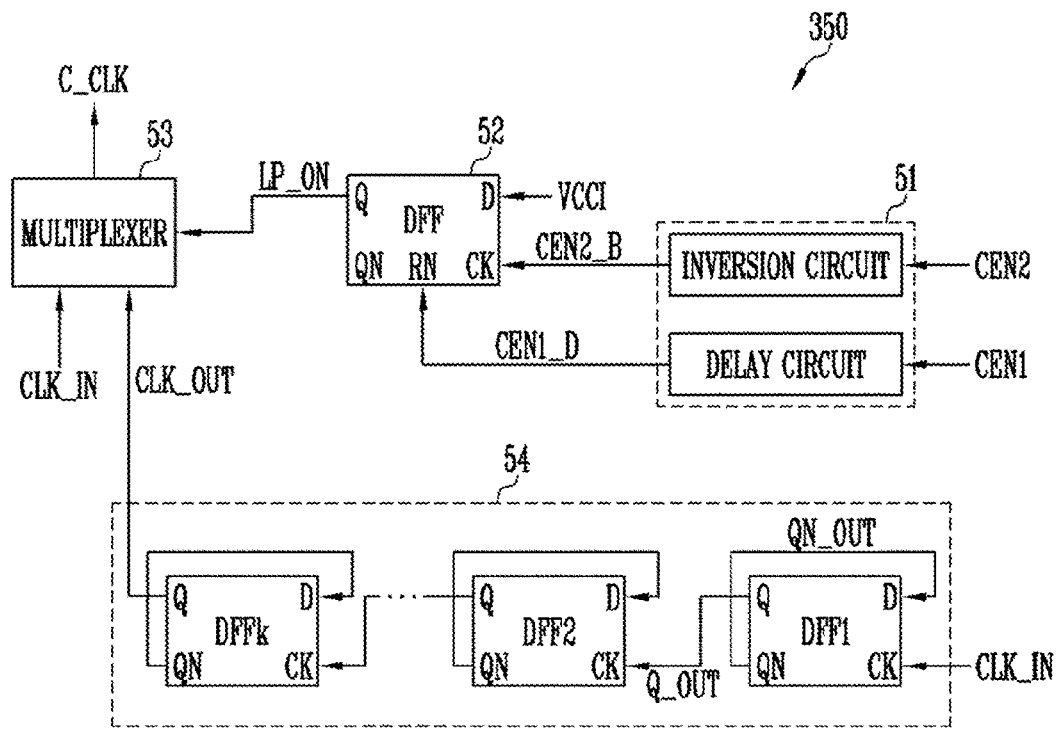
FIG. 6 is a view illustrating an embodiment of the clock frequency driver of FIG. 3.

FIG. 6 is a view illustrating an embodiment of the clock frequency driver of FIG. 3.

Referring to FIG. 6, the clock frequency driver 350 includes an enable signal driver 51, a multiplexer enable circuit 52, a multiplexer 53 and a clock frequency control circuit 54. The connection relationship of the elements of the clock frequency driver 350 will be described below.

The enable signal driver 51 may include a delay circuit and an inversion circuit. The delay circuit may output a delay signal CEN1_D in response to the first clock enable signal CEN1. The inverter circuit may output an inverted signal CEN2_B in response to the second clock enable signal CEN2.

The multiplexer enable circuit 52 outputs a multiplexer enable signal LP_ON in response to an external power supply voltage VCCI, the delay signal CEN1_D and the inverted signal CEN2_B. In this particular embodiment, the multiplexer enable circuit 52 may be embodied by a D flip-flop (DFF). The external power supply voltage VCCI is applied through a first input terminal D. The inverted signal CEN2_B is applied through a second input terminal CK. The delay signal CEN1_D is applied through a third input terminal RN. The multiplexer enable signal LP_ON is output through a first output terminal Q.

The multiplexer 53 outputs a clock C_CLK in response to the multiplexer enable signal LP_ON, an input clock CLK_IN and an output clock CLK_OUT.

The clock frequency control circuit 54 outputs the output clock CLK_OUT in response to an input clock CLK_IN. The clock frequency control circuit 54 may include first to k-th D flip-flops DFF1 to DFFk (where k is a positive integer). The first to k-th D flip-flops DFF1 to DFFk may be connected to each other in a cascade manner and may be connected to each other in series, in parallel, or the combination thereof. In this particular embodiment, the first to k-th D flip-flops DFF1 to DFFk may be connected in series to each other. When an input clock CLK_IN is applied to a second input terminal CK of the first D flip-flop DFF1, a second signal output QN_OUT is outputted through a second output terminal QN of the first D flip-flop DFF1 and is fed back to a first input terminal D of the first D flip-flop DFF1. Subsequently, a first signal output Q_OUT is outputted through a first output terminal Q of the first D flip-flop DFF1 and is applied to a second input terminal CK of the second D flip-flop DFF2. In this way, the first to k-th D flip-flops DFF1 to DFFk are connected to each other. A signal output from a first output terminal Q of the last k-th D flip-flop DFFk becomes the output clock CLK_OUT. The output clock CLK_OUT is applied to the multiplexer 53.

Herein below, the operation of the voltage regulator 3000 including the clock frequency driver 350 will be described.

Figure 7:
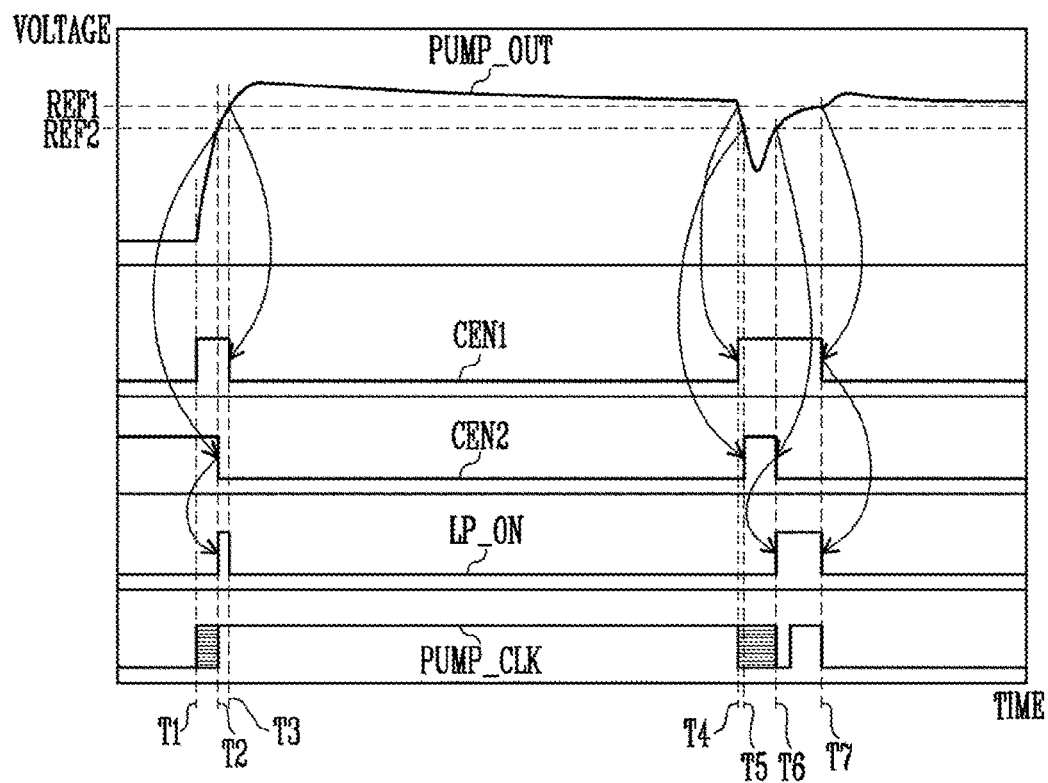
FIG. 7 is a view illustrating the operation of the voltage regulator according to an embodiment of the present disclosure.

FIG. 7 is a view illustrating the operation of the voltage regulator according to an embodiment of the present disclosure.

For the sake of better understanding, the operation of the voltage regulator 3000 will be described with reference to FIGS. 3, 6, and 7.

Referring to FIGS. 3, 6, and 7, when the pump 300 is activated in response to a pump enable signal ENA, the pump 300 outputs a pump-out voltage PUMP_OUT. As the level of the pump-out voltage PUMP_OUT begins to increase, the level of the divided voltage DIV also begins to increase. When the level of the divided voltage DIV begins to increase, the first clock enable signal CEN1 makes a transition from low to high. In a section from time T1 to time T2, the level of the pump-out voltage PUMP_OUT is lower than the first reference voltage REF1 or the second reference voltage REF2. Within the T1 to T2 section, the pump clock PUMP_CLK may be clocked.

When the pump-out voltage PUMP_OUT exceeds the second reference voltage REF2 at time T2, the second enable signal CEN2 makes a transition from high to low. Consequently, the multiplexer enable signal LP_ON makes a transition from low to high. When the multiplexer enable signal LP_ON becomes high, an output clock CLK_OUT that is lower in frequency than the input clock CLK_IN is output by the clock frequency control circuit 54, and the multiplexer 53 outputs a low-frequency clock C_CLK. For example, the frequency of the input clock CLK_IN may be defined as a first frequency, and the frequency of the output clock CLK_OUT may be defined as a second frequency. In this case, the second frequency may be lower than the first frequency, and the frequencies may be determined depending on the number of first to k-th D flip-flops DFF1 to DFFk. For instance, when the clock frequency control circuit 54 includes first to fourth D flip-flops DFF1 to DFF4, the second frequency may be 1/16 of the first frequency. In other words, if the first frequency is 20 MHz, the second frequency is 1.25 MHz.

Since the frequency of the clock C_CLK is reduced by the output clock CLK_OUT, the frequency of the pump clock PUMP_CLK that is output in response to the clock C_CLK is also simultaneously reduced. Consequently, the rate at which the pump 300 pumps the pump-out voltage PUMP_OUT can be reduced, whereby a high level of peak voltage can be prevented from being applied to the capacitor 310.

When the divided voltage DIV exceeds the first reference voltage REF1 at time T3, the pump 300 does not perform a rapid pumping operation to prevent increasing the pump-out voltage PUMP_OUT.

If the pump-out voltage PUMP_OUT declines due to an external factor at time T4, the voltage regulator 3000 may perform the above-mentioned operations of the section between time T1 and time T3 to increase the pump-out voltage PUMP_OUT to a target level again while the pump-out voltage PUMP_OUT is outputted.

For example, until the pump-out voltage PUMP_OUT reaches the second reference voltage REF2, the voltage regulator 3000 rapidly increases the pump-out voltage PUMP_OUT in accordance to the first frequency. In the section between time T6 and time T7, in which the pump-out voltage PUMP_OUT is higher than the second reference voltage REF2 and lower than the first reference voltage REF1, the voltage regulator 3000 uses the second frequency lower than the first frequency to increase the pump-out voltage PUMP_OUT. That is, when the pump-out voltage PUMP_OUT is increased to a level close to the target voltage, the frequency is reduced so as to reduce the rate at which the pump-out voltage PUMP_OUT is increased, thereby, preventing the pump-out voltage PUMP_OUT from over-peaking. In other words, the capacitor 310 can be embodied by a low-voltage transistor because the use of the low frequency prevents the low-voltage transistor from being damaged.

When the pump-out voltage PUMP_OUT exceeds the first reference voltage REF1, the voltage regulator 3000 is operated with the first frequency to prevent deterioration in performance of the voltage regulator 3000.

Figure 8:
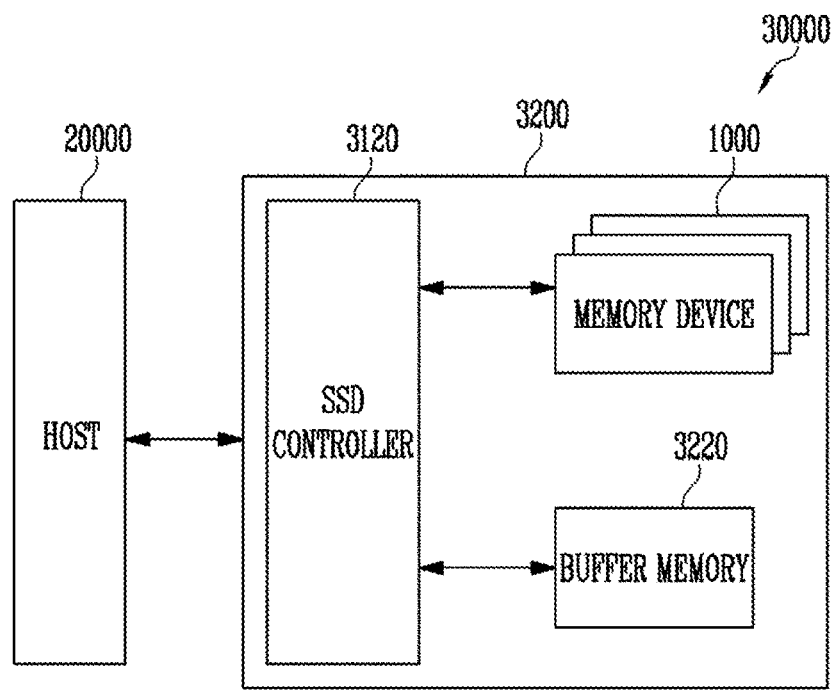
FIG. 8 is a block diagram illustrating a solid state drive including a memory device according to an embodiment of the present invention.

FIG. 8 is a block diagram illustrating a solid state drive (SSD) including a memory device according to an embodiment of the present invention.

Referring to FIG. 8, a drive device 30000 includes a host 20000 and an SSD 3200. Although not shown in the drawing, the SSD 3200 may include the voltage regulator 3000 illustrated in FIG. 3.

The SSD 3200 includes an SSD controller 3120, a buffer memory 3220, and a memory device 1000.

The memory device 1000 may have substantially the same configuration as that of FIG. 2; therefore, detailed description of the memory device 1000 will be omitted.

The SSD controller 3120 provides a physical connection between the host 20000 and the SSD 3200. That is, the SSD controller 3120 provides an interface with the SSD 3200 in correspondence to a bus format of the host 20000. More specifically, the SSD controller 3120 decodes a command provided from the host 20000. According to a decoded result, the SSD controller 3120 accesses the memory device 1000. The bus format of the host 20000 may include Universal Serial Bus (USB), small Computer System Interface (SCSI), PCI express, Advanced Technology Attachment (ATA), Parallel ATA (PATA), Serial ATA (SATA), and/or Serial Attached SCSI (SAS), among others.

The buffer memory 3220 temporarily stores data provided from the host 20000 and data read from the memory device 1000. If data of the memory device 1000 has been cached when a read request of the host 20000 is made, the buffer memory 3220 supports a cache function for directly providing the cached data to the host 20000. In general, a data transfer rate of the bus format (for example, SATA or SAS) of the host 20000 may be higher than that of a memory channel of the SSD 3200. In this regard, when an interface speed of the host 20000 is higher than the data transfer rate of the memory channel of the SSD 3200, the high-capacity buffer memory 3220 can minimize performance deterioration that may occur due to a speed difference. The buffer memory 3220 may be provided with a synchronous DRAM for providing sufficient buffering capacity in the SSD 3200, which may be used as a high capacity auxiliary memory device.

The memory device 1000 may be provided as a storage medium for the SSD 3200. For example, the memory device 1000 may be provided with a nonvolatile memory device having a high data storage capacity, as illustrated in FIG. 1. In particular, among nonvolatile memory devices, a NAND-type flash memory may be provided as the memory device 1000.

Figure 9:
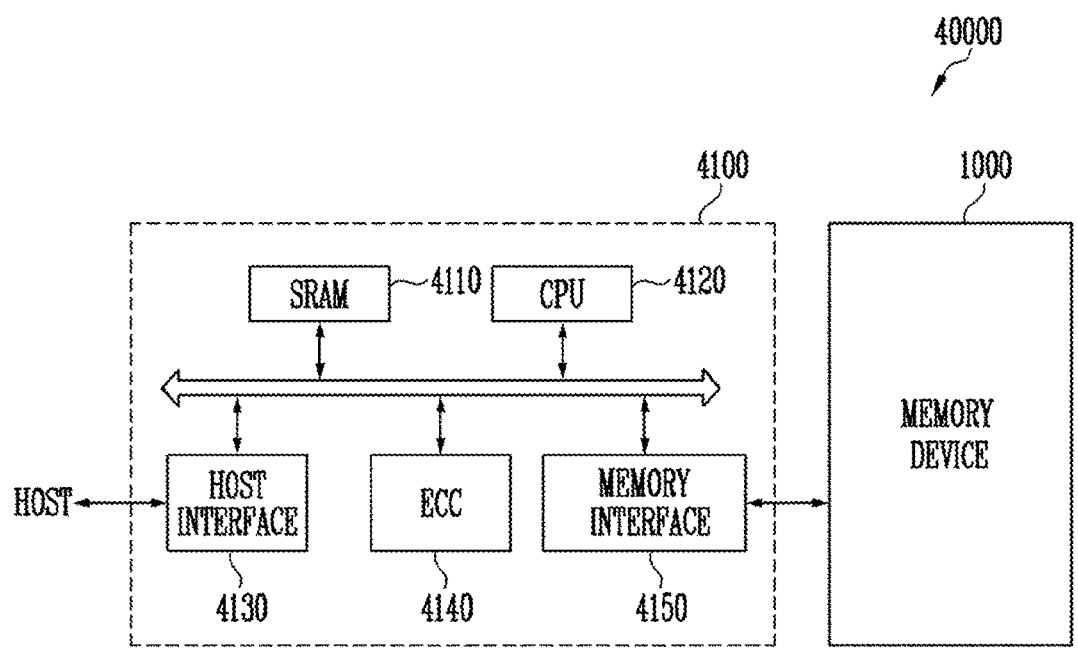
FIG. 9 is a block diagram illustrating a memory system including a memory device according to an embodiment of the present invention.

FIG. 9 is a block diagram illustrating a memory system including a memory device according to an embodiment of the present invention.

Referring to FIG. 9, the memory system 40000, according to the present embodiment, may include a controller 4100 and the memory device 1000. Although not shown in the drawing, the controller 4500 may include the voltage regulator 3000 illustrated in FIG. 3.

The memory device 1000 may have substantially the same configuration as that of FIG. 2; therefore, detailed description of the memory device 1000 will be omitted.

The controller 4100 may be configured to control the memory device 1000. An SRAM 4110 may be used as a working memory of a central processing unit (CPU) 4120. A host interface 4130 includes a data exchange protocol of a host connected to the memory system 40000. An error correction circuit (ECC) 4140 provided in the controller 4100 may detect and correct an error in data read from the memory device 1000. The memory interface 4150 may be configured to interface with the memory device 1000. The CPU 4120 may perform control operations for data exchange of the controller 4100. Although not illustrated in FIG. 9, the memory system 40000 may further include ROM (not shown) for storing code data to interface with the host.

The memory system 40000 according to the present embodiment may be applied to a device such as a computer, an ultra-mobile PC (UMPC), workstation, net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting/receiving information in an wireless environment, one of various devices for forming a home network, or the like.

Figure 10:
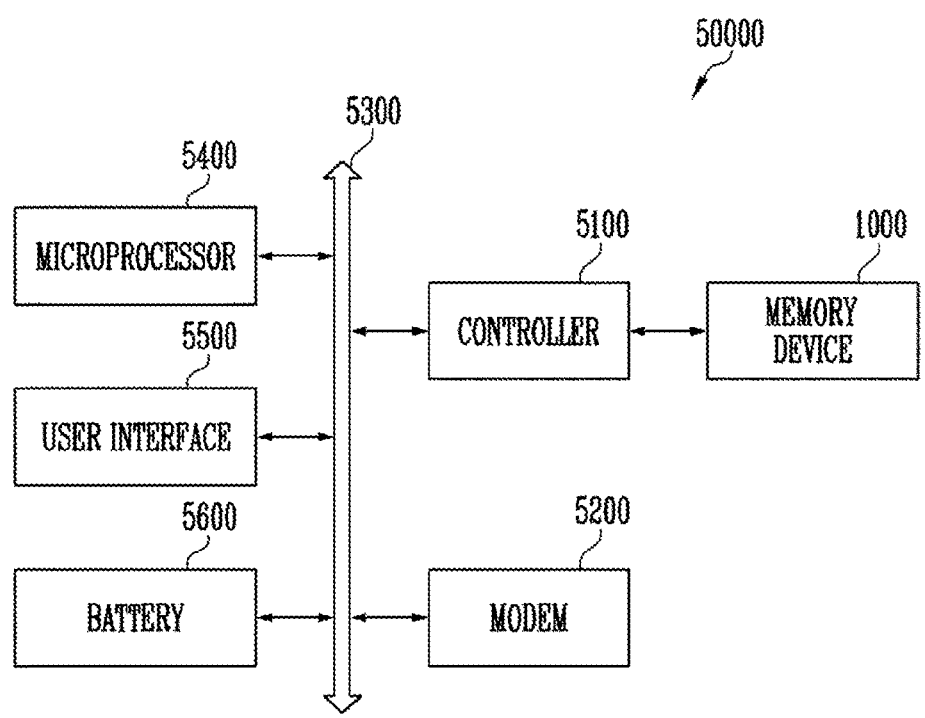
FIG. 10 is a view illustrating the schematic configuration of a computing system including a memory device according to an embodiment of the present invention.

FIG. 10 is a view illustrating the schematic configuration of a computing system including a memory device according to an embodiment of the present invention.

Referring to FIG. 10, the computing system 50000 may include a memory device 1000, a controller 5100, a modem 5200, a microprocessor 5400, and a user interface 5500 which are electrically connected to a bus 5300. Although not shown in the drawing, a voltage output from the voltage regulator 3000 illustrated in FIG. 3 may be supplied to each device shown in FIG. 10.

If the computing system 50000 according to the present embodiment is a mobile device, an additional battery 5600 may be provided to supply an operating voltage of the computing system 50000. Although not shown in the drawing, the computing system 50000, according to the present embodiment, may further include an application chip set, a camera image processor (CIS), a mobile DRAM, or the like.

The memory device 1000 may have the substantially same configuration as that of FIG. 2; therefore, detailed description of the memory device 1000 will be omitted.

The controller 5100 and the memory device 1000 may form a solid state drive/disk (SSD).

A semiconductor device and a memory control unit, according to the present disclosure, may be mounted using various types of packages. For example, the semiconductor device or the memory control unit may be packaged using packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like. According to various embodiments of the present disclosure, while having a reduced size, a voltage regulator can stably supply voltages. Therefore, the reliability of a memory device which receives a voltage from the voltage regulator can be improved. Furthermore, the reliability of a memory system including the voltage regulator and the memory device can also be improved.

While the spirit and scope of the present disclosure are described by detailed exemplary embodiments, it should be noted that the above-described embodiments are merely descriptive and should not be considered limiting. Further, it should be understood by those skilled in the art that various changes, substitutions, and alternations may be made herein without departing from the scope of the disclosure as defined by the following claims.

What is claimed is:

1. A method of operating a voltage regulator, comprising:
   outputting a pump-out voltage using a pump clock having a first frequency;
   performing a pumping operation of the pump-out voltage using the pump clock having a second frequency lower than the first frequency when the pump-out voltage exceeds a second reference voltage but does not exceed a first reference voltage; and
   stopping the pumping operation when the pump-out voltage exceeds the first reference voltage,
   wherein the outputting of the pump-out voltage using the pump clock having the first frequency comprises:
   dividing the pump-out voltage and outputting a divided voltage;
   comparing the divided voltage with the first reference voltage and outputting a first enable signal;
   outputting a delay signal in response to the first enable signal;
   outputting a clock having the first frequency in response to the delay signal;
   outputting the pump clock having the first frequency in response to the clock; and
   outputting the pump-out voltage in response to the pump clock.

2. The method according to claim 1, wherein the outputting of the pump-out voltage using the pump clock having the second frequency comprises:
   dividing the pump-out voltage and outputting a divided voltage;
   comparing the divided voltage with the second reference voltage and outputting a second enable signal;
   outputting an inverted signal in response to the second enable signal;
   outputting a clock having the second frequency in response to the inverted signal;
   outputting the pump clock having the second frequency in response to the clock; and
   outputting the pump-out voltage in response to the pump clock.

3. The method according to claim 1, wherein the outputting of the pump clock comprises:
   outputting a delay signal in response to a first enable signal;
   outputting an inverted signal in response to a second enable signal;
   outputting a multiplexer enable signal in response to the delay signal or the inverted signal;

outputting an output clock in response to an input clock;
outputting a clock in response to the multiplexer enable signal and the input clock or the output clock; and
outputting the pump clock in response to the clock,
wherein the input clock has the first frequency, and
wherein the output clock has the second frequency.

4. The method according to claim 3, wherein the outputting of the multiplexer enable signal comprises:
applying an external power supply voltage to a multiplexer enable circuit through a first input terminal;
applying the inverted signal to the multiplexer enable circuit through a second input terminal;
applying the delayed signal to the multiplexer enable circuit through a third input terminal; and
outputting the multiplexer enable signal in response to the external power supply voltage, the inverted signal, and the delayed signal.

* * * * *